(12) United States Patent
Yin et al.

(10) Patent No.: US 11,495,638 B2
(45) Date of Patent: Nov. 8, 2022

(54) CROSSBAR ARRAY CIRCUITS WITH 2T1R RRAM CELLS FOR LOW VOLTAGE OPERATIONS

(71) Applicant: TETRAMEM INC., Newark, CA (US)

(72) Inventors: Wenbo Yin, Newark, CA (US); Ning Ge, Newark, CA (US)

(73) Assignee: TETRAMEM INC., Fremont, CA (US)

( * ) Notice: Subject to any disclaimer, the term of this patent is extended or adjusted under 35 U.S.C. 154(b) by 0 days.

(21) Appl. No.: 16/550,258

(22) Filed: Aug. 25, 2019

(65) Prior Publication Data

US 2022/0130902 A1    Apr. 28, 2022

(51) Int. Cl.
*G11C 13/00* (2006.01)
*H01L 27/24* (2006.01)

(52) U.S. Cl.
CPC ...... *H01L 27/2436* (2013.01); *G11C 13/0069* (2013.01); *G11C 13/0097* (2013.01); *G11C 2213/74* (2013.01); *G11C 2213/79* (2013.01)

(58) Field of Classification Search
CPC .................................................. G11C 13/003
USPC ......................................................... 365/148
See application file for complete search history.

(56) References Cited

U.S. PATENT DOCUMENTS

| 9,165,610 | B1* | 10/2015 | Poh | G11C 11/1659 |
| 2010/0195415 | A1* | 8/2010 | Seko | G11C 5/145 |
| | | | | 365/189.09 |
| 2017/0243634 | A1* | 8/2017 | Kohara | G11C 11/418 |
| 2019/0080754 | A1 | 3/2019 | Tran | |
| 2019/0325933 | A1 | 10/2019 | Lee | |
| 2019/0355788 | A1* | 11/2019 | Chang | H01L 23/528 |
| 2020/0020742 | A1* | 1/2020 | Liu | G11C 11/1675 |
| 2020/0098428 | A1* | 3/2020 | Gaillardon | G06F 17/16 |
| 2021/0159274 | A1 | 5/2021 | Ge | |

OTHER PUBLICATIONS

PCT Search Report and Written Opinion for PCT/US22/71987, dated Jul. 27, 2022, 8 pages.

* cited by examiner

*Primary Examiner* — Min Huang
(74) *Attorney, Agent, or Firm* — Jaffery Watson Mendonsa & Hamilton LLP

(57) ABSTRACT

Technologies relating to crossbar array circuits with a 2T1R RRAM cell that includes at least one NMOS transistor and one PMOS transistor for low voltage operations are disclosed. An example apparatus includes a word line; a bit line; a first NMOS transistor; a second PMOS transistor; and an RRAM device. The first NMOS transistor and the second PMOS transistor are in parallel as a pair, wherein the pair connects in series with the RRAM device. The apparatus may further include an inverter, via which the second gate terminal of the second PMOS transistor is connected to the first gate terminal.

14 Claims, 8 Drawing Sheets

| RESET current target | 1T1R cell area (over minimum transistor area) | 2T1R cell area (over minimum transistor area) | Area Ratio |
|---|---|---|---|
| 2.31mA/2.34mA | 20um NMOS device(20x) | 6.7um pass-gate device(13.4x) | 67% |
| 2.67mA/2.78mA | 40um NMOS device(40x) | 10um pass-gate device(20x) | 50% |
| 2.83mA/2.97mA | 60um NMOS device(60x) | 12um pass-gate device(24x) | 40% |

| RESET current target | 1T1R cell VDD | 2T1R cell VDD (for same size as 1T1R cell) | Power Ratio |
|---|---|---|---|
| 2.3mA | 5V | 4.37V | 76% |

1R2T RRAM Cell

2T1R RRAM Cell

CROSSBAR ARRAY CIRCUITS WITH 2T1R RRAM CELLS FOR LOW VOLTAGE OPERATIONS

TECHNICAL FIELD

The present disclosure relates generally to crossbar array circuits and more specifically to crossbar array circuits with a 2T1R RRAM cell that includes at least one NMOS transistor and one PMOS transistor for low voltage operations.

BACKGROUND

Traditionally, a crossbar array circuit may include horizontal metal wire rows and vertical metal wire columns (or other electrodes) intersecting with each other in a two-dimension (2D) plane, with crossbar devices formed at the intersecting points. The crossbar array may be used in non-volatile solid-state memory, signal processing, control systems, high-speed image processing, neural network, machine learning, and other applications.

A Resistive Random-Access Memory (RRAM) is a two-terminal passive device that is capable of changing resistance upon sufficient electrical stimulations, which have attracted significant attention for high-performance nonvolatile memory applications. The resistance of the RRAM may be electrically switched between two states: high-resistance state (HRS) and a low-resistance state (LRS). The switching event from HRS to LRS is called "Set" or "On" switching process. Conversely, the switching from LRS to HRS is called "Reset" or "Off" switching process.

A Metal-Oxide-Semiconductor Field-Effect Transistor (MOSFET, MOS-FET, or MOS FET), also known as the metal-oxide-silicon transistor, MOS transistor, or simply MOS, is a Field-Effect Transistor (FET) that is fabricated by a controlled oxidation of silicon. If a MOSFET is an n-channel MOSFET (also referred to as an NMOS FET), then the source and drain of the MOSFET are n+ regions and the body of the MOSFET is a p region. If a MOSFET is a p-channel MOSFET (also referred to as an NMOS FET), then the source and drain of the MOSFET are p+ regions and the body of the MOSFET is an n region. The source is so named because it is the source of the charge carriers (electrons for n-channel, holes for p-channel) that flow through a channel; similarly, the drain is where the charge carriers leave a channel.

SUMMARY

Technologies relating to crossbar array circuits with a 2T1R RRAM cell that includes at least one NMOS transistor and one PMOS transistor for low voltage operations are disclosed.

An example apparatus includes a word line; a bit line; a first NMOS transistor; a second PMOS transistor; and an RRAM device. The first NMOS transistor and the second PMOS transistor are in parallel as a pair, wherein the pair connects in series with the RRAM device.

In some implementations, the RRAM device is connected between a first source terminal of the first NMOS transistor and the bit line, and between a second source terminal of the second PMOS transistor and the bit line; a first drain terminal of the first NMOS transistor is connected to the word line; a second drain terminal of the second PMOS transistor is connected to the word line; and a first gate terminal of the first NMOS transistor is connected to a first selector voltage source.

The apparatus, in some implementations, further includes: an inverter, via which the second gate terminal of the second transistor is connected to the first gate terminal.

The RRAM device is, in some implementations, connected between the first NMOS transistor and the bit line, and between the second PMOS transistor and the bit line.

The inverter, in some implementations, comprises an NMOS inverter, a PMOS inverter, a CMOS inverter, or a combination thereof.

The RRAM device is, in some implementations, connected between a first source terminal of the first NMOS transistor and the bit line, and between a second source terminal of the second PMOS transistor and the bit line.

In some implementations, a first drain terminal of the first NMOS transistor is connected to the word line; wherein a second drain terminal of the second PMOS transistor is connected to the word line; and wherein a first gate terminal of the first NMOS transistor is connected to a first selector voltage source.

In some implementations, the apparatus comprises: two or more NMOS transistors including the first NMOS transistor.

In some implementations, the apparatus comprises: two or more PMOS transistors including the second PMOS transistor.

In some implementations, the apparatus comprises: two or more NMOS transistors and two or more PMOS transistors.

An apparatus that comprises: a word line; a bit line; a first transistor; a second transistor; and an RRAM device, wherein the first transistor and the second transistor are connected in series with the RRAM device. The RRAM device is connected between a first drain terminal of the first transistor and the word line, and between a second drain terminal of the second transistor and the word line. A first source terminal of the first transistor is connected to the bit line; a second source terminal of the second transistor is connected to the bit line; and a first gate terminal of the first transistor is connected to a first selector voltage source.

In some implementations, the apparatus comprises an inverter, via which the second gate terminal of the second PMOS transistor is connected to the first gate terminal via the inverter.

In some implementations, the first transistor is a NMOS transistor and the second transistor is a PMOS transistor.

In some implementations, the apparatus comprises: two or more NMOS transistors including the first NMOS transistor.

In some implementations, the apparatus comprises: two or more PMOS transistors including the second PMOS transistor.

In some implementations, the apparatus comprises: two or more NMOS transistors and two or more PMOS transistors.

BRIEF DESCRIPTION OF THE DRAWINGS

FIG. 5 is a table illustrating various design parameters of 2T1R RRAM cells and 1T1R cells.

FIG. 6 is a summary chart illustrating the voltage and power consumption of two different designs.

The implementations disclosed herein are illustrated by way of example, and not by way of limitation, in the figures of the accompanying drawings. Like reference numerals refer to corresponding parts throughout the drawings.

DETAILED DESCRIPTION

Various designs of crossbar array circuits with a 2T1R RRAM cell that includes at least one NMOS transistor and one PMOS transistor are disclosed. The technologies described in the present disclosure may provide the following technical advantages.

First, the disclosed implementations of 2T1R RRAM cells (which include at least one NMOS and at least one PMOS) may increase RESET current and reduce the body effect of conventionally 1T1R designs (particularly, the RRAM cells that include only one NMOS).

Second, though the disclosed implementations of 2T1R RRAM cells may seemingly require more area size than conventional 1T1R design do, results from simulations and experiments prove such implementations in fact require less area size than the conventional 1T1R designs do, when producing a same or similar level of RESET current, a highly desirable feature.

Third, the power consumption of the disclosed implementations of 2T1R RRAM cells, according to results from simulations and experiments, is lower than that of conventional 1T1R designs, when a same RESET current level is used, another highly desirable feature.

Fourth, some disclosed implementations of 2T1R RRAM cells use an inverter to control both the at least NMOS and the at least PMOS to reduce routing overhead without increasing area size.

Figures 1A, 1B:
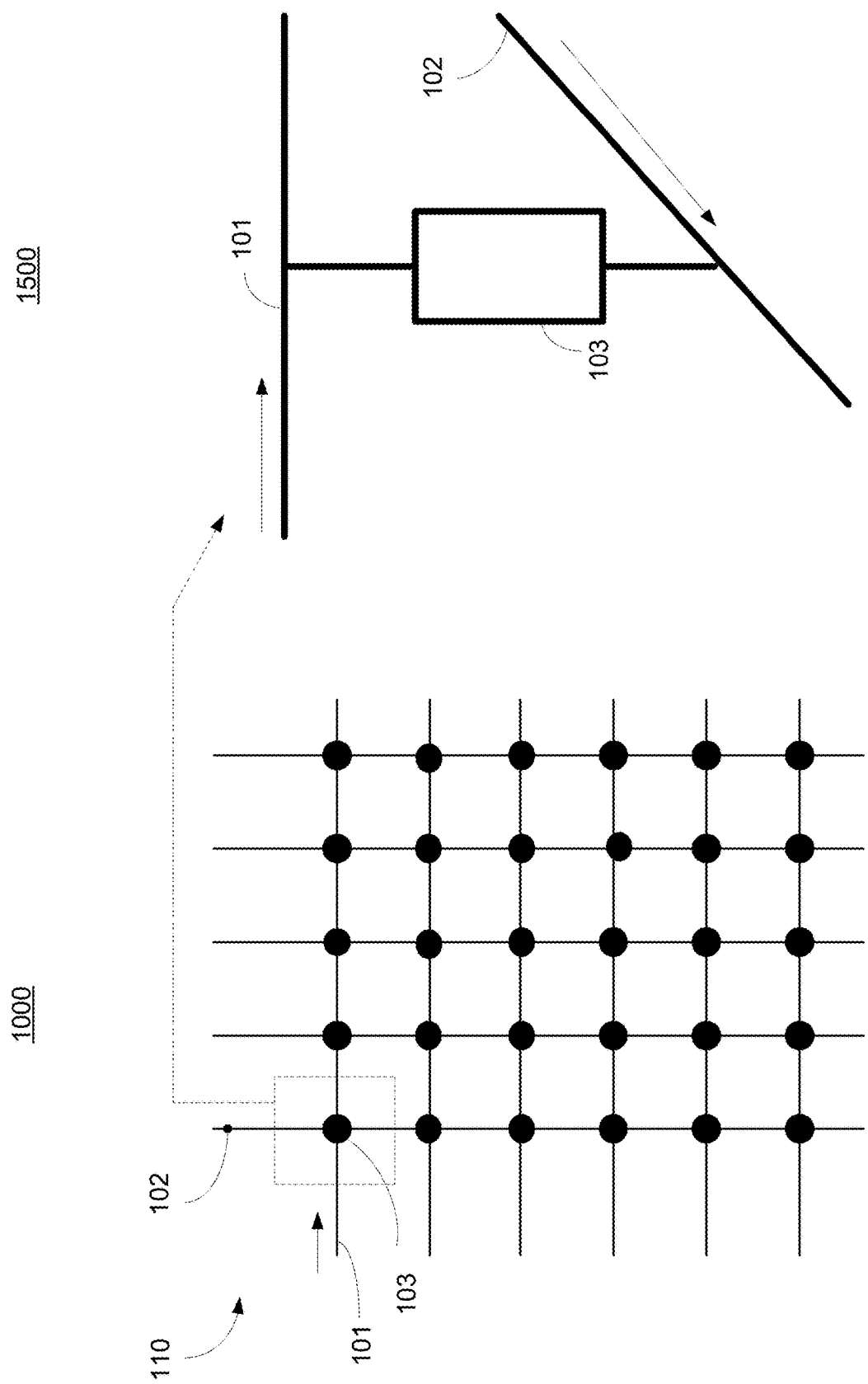
FIG. 1A is a block diagram illustrating an example crossbar array circuit.
FIG. 1B is a block diagram illustrating an example cross-point device within the crossbar array circuit shown in FIG. 1A.

FIG. 1A is a block diagram 1000 illustrating an example crossbar array circuit 110 in accordance with some implementations of the present disclosure. As shown in FIG. 1A, the crossbar array circuit 110 includes one or more word lines (e.g., a word line 101), one or more bit lines (e.g., a bit line 102), and one or more cross-point devices (e.g., a cross-point device 103).

FIG. 1B is a block diagram 1500 illustrating a partially enlarged view of the example cross-point device 103 shown in FIG. 1A, in accordance with some implementations. As shown in FIG. 1B, the cross-point device 103 is connected to both the word line 101 and the bit line 102 of the crossbar array circuit 110 described above.

Figures 2A, 2B:
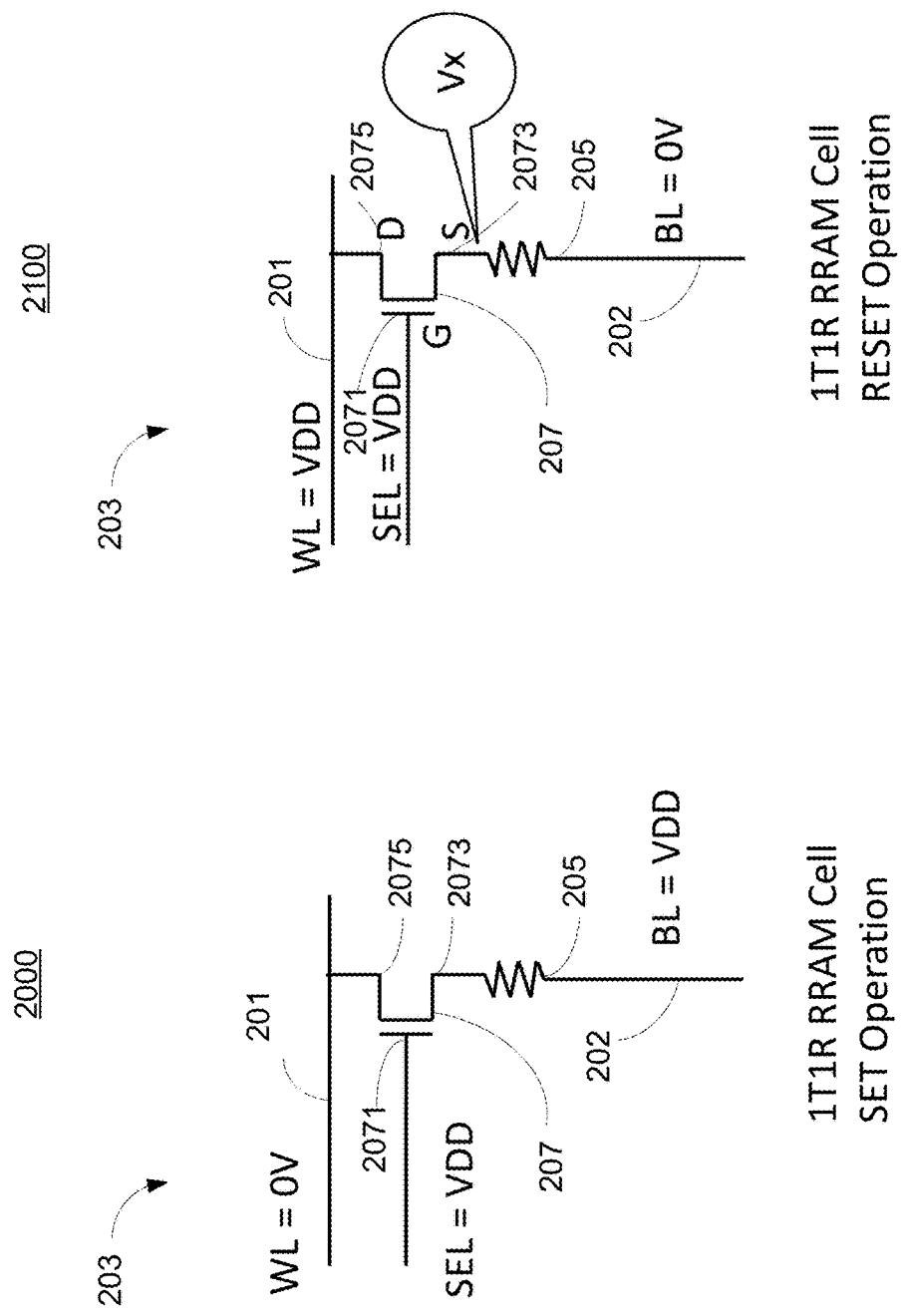
FIGS. 2A-2B are block diagrams illustrating an example 1T1R RRAM cell in different operations in accordance with some implementations of the present disclosure.

FIGS. 2A-2B are block diagrams illustrating an example 1T1R RRAM cell in different operations in accordance with some implementations of the present disclosure. FIG. 2A illustrates an example SET operation of a 1T1R RRAM cell 203; FIG. 2B illustrates an example RESET operation of the 1T1R RRAM cell 203.

As shown in FIGS. 2A and 2B, the 1T1R RRAM cell 203 includes a word line 201, a bit line 202, a first transistor 207 (e.g. an NMOS transistor 207), and an RRAM device 205. The NMOS transistor 207 is connected in series with the RRAM device 205. To be more specific, the RRAM device 205 is connected between a source terminal 2073 of the NMOS transistor 207 and the bit line 202. Gate terminal 2071 of the NMOS transistor 207 is connected to a selector voltage source, which enables the NOMS transistor 207 to control whether the RRAM device 205 is selected to for programming or not.

As shown in FIG. 2A, the word line 201 is set to a 0V voltage, and the bit line 202 is set to voltage VDD during the SET operation (with selector voltage source set to voltage VDD).

As shown in FIG. 2B, the word line 201 is set to voltage VDD, while the bit line 202 is set to 0V voltage during a RESET operation.

First, an analysis of the NMOS transistor is as follow:

$$Vds = VDD - Vx \quad (1)$$

$$Veff = Vgs - Vtn = VDD - Vx - Vtn \quad (2)$$

Where Vtn is the NMOS's threshold voltage.

Because Vds>Veff, the NMOS transistor is operating within a saturation region. When the NMOS transistor is operating within a saturation region, changes to Vds will not produce significant Ids increase. Also, Because Vgs=VDD−Vx=>Vtn, to turn on NMOS, the Vgs should be higher than Vtn. Vx<=VDD−Vtn.

Therefore, Vx cannot become greater than Vtn. Vx is thus kept relatively low, due to limit imposed a transistor's Vtn. The low RESET current for the RRAM device 205 is an issue and therefore a higher VDD should be applied to obtain the required RESET current.

Second, an analysis of the body effect of the NMOS transistor is as follow:

An example model for analyzing the body effect of an NMOS transistor is:

$$V_T = V_{T0} + \gamma \cdot \left( \sqrt{|-2\phi_F + V_{SU}|} - \sqrt{|2\phi_F|} \right)$$

$$\gamma = \frac{\sqrt{2q \cdot N_A \cdot \varepsilon_{Si}}}{C_{ai}}$$

As can be seen, because Vsb=Vx>0, the threshold voltage of the NMOS transistor Vt may be increased significantly.

In summary, RESET current is limited in implementations that involve 1T1R cells for at least the following reasons: (1) when a transistor is operating within a saturation region, increasing WL voltage may not increase the RESET current significantly; (2) the NMOS source voltage is limited to no greater than the Vtn.; and (3) the existence of significant body effect.

As a result, usually it requires: (1) A large-sized NMOS access transistor; and (2) high voltage for RESET operations. A 1R1T structure (as opposed to the 1T1R structure) may reduce the RESET current issue seen in the 1T1R structure. Having a transistor and a RRAM in a reversed order, a 1R1T structure suffers from the same drawback during SET operations, because To address these technical challenges, various implementations of 2T1R RRAM cells described in the present disclosure would increase RESET current and reduce body effect, without increasing the area size of a cell (as shown by simulation and experimentation results).

Figures 3A, 3B:
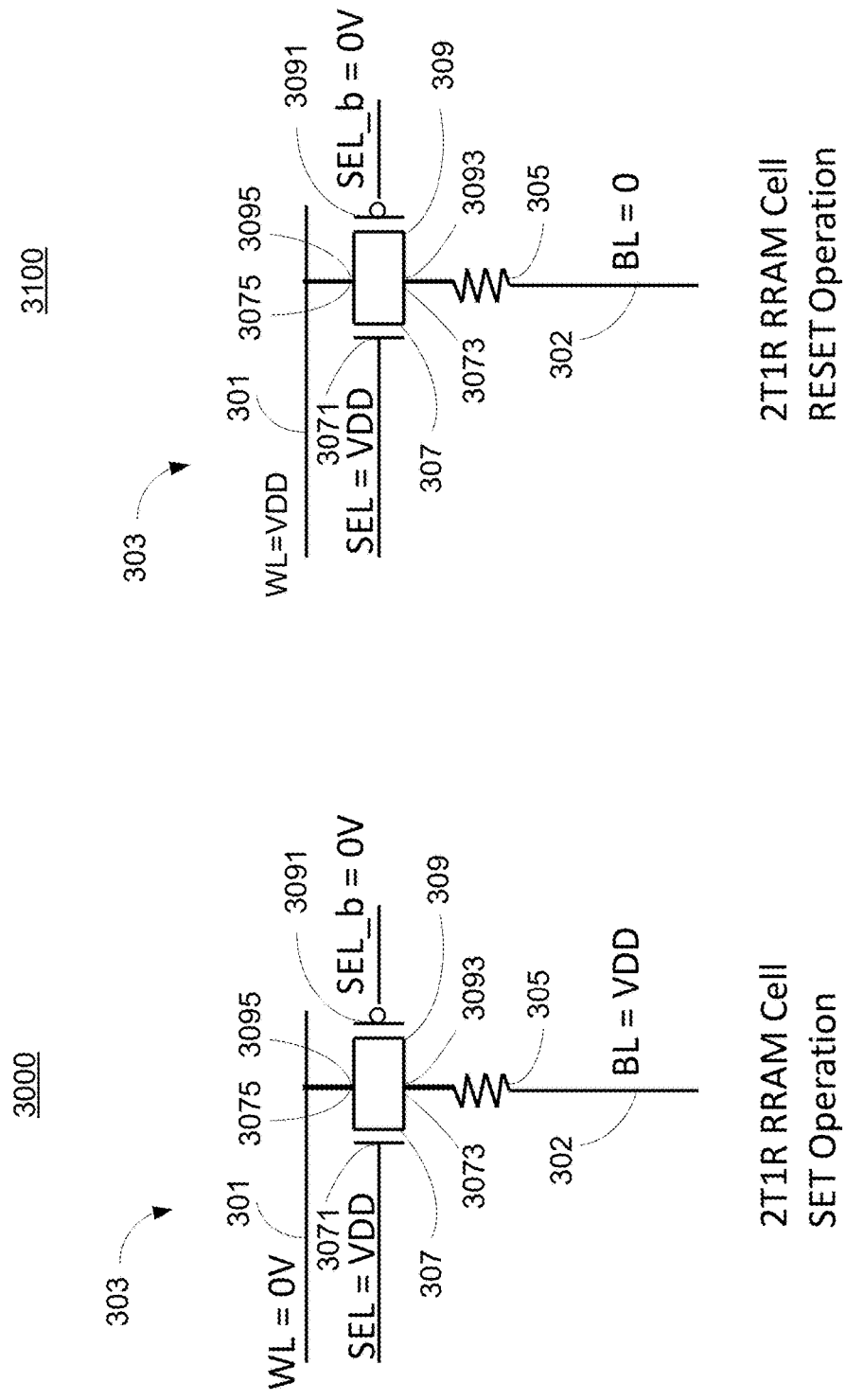
FIGS. 3A-3B are block diagrams illustrating an example 2T1R RRAM cell in different operations in accordance with some implementations of the present disclosure.

FIGS. 3A-3B are block diagrams illustrating an example 2T1R RRAM cell 303 in different operations in accordance with some implementations of the present disclosure.

As shown in FIGS. 3A and 3B, a 2T1R RRAM cell 303 includes a word line 301, a bit line 302, a first transistor 307 (e.g. an NMOS transistor 307), a second transistor 309 (e.g. a PMOS transistor 309), and an RRAM device 305. The NMOS transistor 307 and the PMOS transistor 309 are connected in series with the RRAM device 305. To be more specific, the RRAM device 305 is connected between a first source terminal 3073 of the NMOS transistor 307 and the bit line 302, and between a second source terminal 3093 of the PMOS transistor 309 and the bit line 302. A first gate terminal 3071 of the NMOS transistor 307 is connected to a first selector voltage source. A second gate terminal 3091 of the PMOS transistor 309 is connected to a second selector voltage source. The first and second selector voltage source enable the NOMS transistor 307 and the PMOS 309 to control whether the RRAM device 305 is selected to be programmed or not. A first drain terminal 3075 of the NMOS transistor 307 is connected to the word line 301. A second drain terminal 3095 of the PMOS transistor 309 is connected to the word line 301.

FIG. 3A illustrates an example SET operation of a 2T1R RRAM cell 303.

As shown in FIG. 3A, the word line 301 is set to 0V voltage, and the bit line 302 is set to VDD voltage during the SET operation (with the first selector voltage source set to VDD voltage and the second selector voltage source set to 0V voltage).

FIG. 3B illustrates an example RESET operation of the 2T1R RRAM cell 303.

As shown in FIG. 3B, the word line 301 is set to 5V voltage, while the bit line 302 is set to 0V voltage during the RESET operation. Including both the PMOS 309 and the NMOS 307 in a RRAM cell may provide the following technical advantages. The 2T1R cell design may significantly increase the RESET current, which produces at least two technical advantages: (1) reduced area size: the same RESET current level may be achieved with reduced cell size; (2) reduce power consumption: the same RESET current level may be achieved with reduced VDD voltage.

Figure 4:
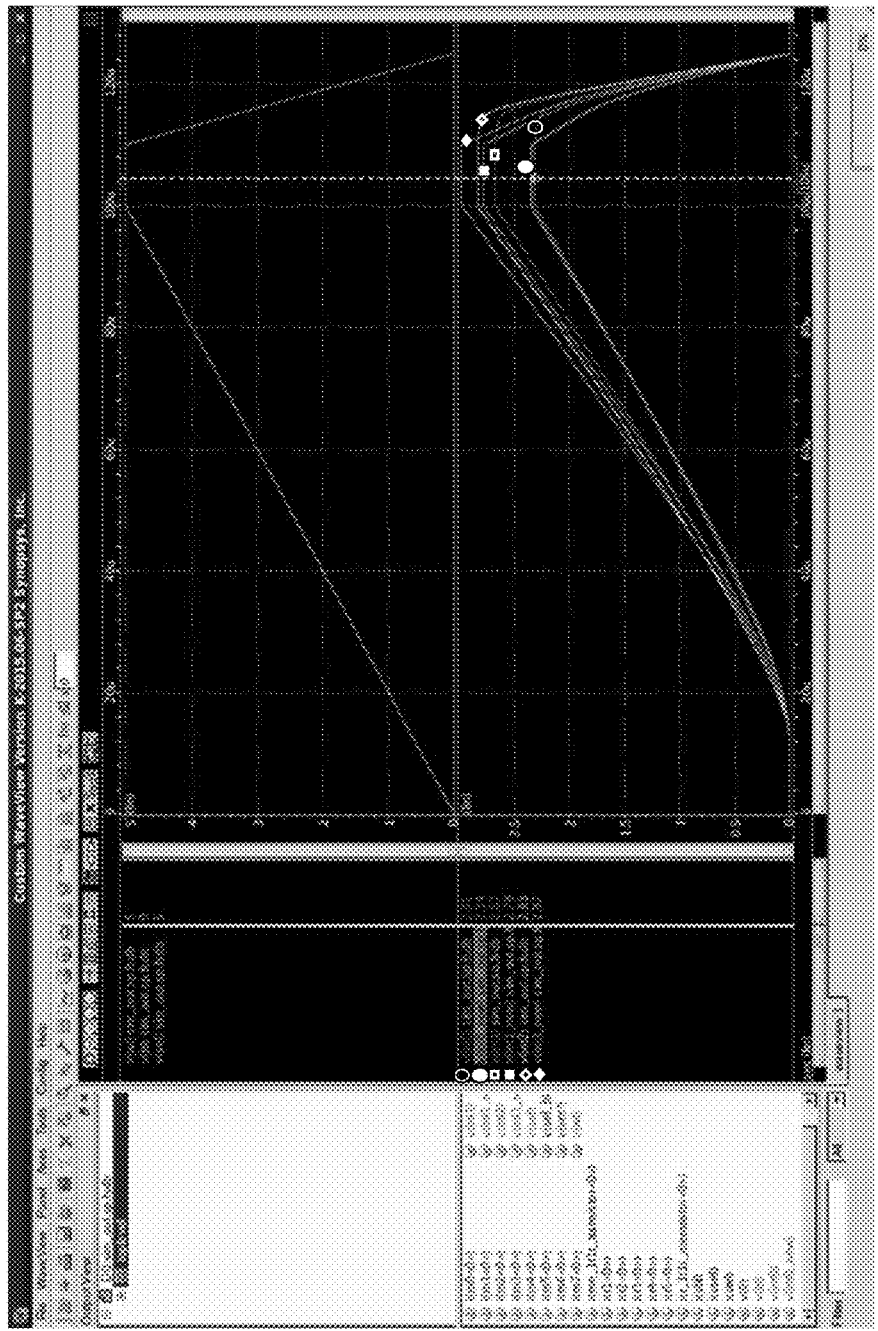
FIG. 4 is a block diagram illustrating simulation results of a 2T1R cell design versus a 1T1R cell design.

FIG. 4 is a block diagram 4000 illustrating simulation results of a 2T1R cell design versus a 1T1R cell design.

FIG. 5 is a table 5000 illustrating various design parameters of 2T1R RRAM cells and 1T1R cells. The table 5000 shows three different levels of target RESET current.

First, providing a 2.31 mA RESET current requires a 20 um NMOS device (1T1R) where the minimum area is 20×; providing a 2.34 mA RESET current requires a 6.7 um pass-gate device (2T1R) where the minimum area is 13.4×.

Second, providing a 2.67 mA RESET current requires a 40 um NMOS device (1T1R) where the minimum area is 40×; while providing a 2.78 mA RESET current requires a 10 um pass-gate device (2T1R) where the minimum area is 20×.

Third, providing a 2.83 mA RESET current requires a 60 um NMOS device (1T1R) where the minimum area is 60×; while requires a 2.97 mA RESET current requires a 12 um pass-gate device (2T1R) where the minimum area is 24×.

Due to the addition of a second transistor, it is often believed that the area size of a 2T1R cell is always greater than that of a 1T1R cell. These results, however, show that when providing a similar level of target RESET current, the area size of a 1T1R cell is generally greater than the area size of a 2T1R cell, ranging from 40% greater to 67% greater. These unexpected results show that 2T1R RRAM cells that includes at least one NMOS transistor and one PMOS transistor in each RRAM cell is technically advantageous, because such designs can provide a predetermined level of RESET current with less area size.

Furthermore, since chip dynamic power is a ratio of Vdd ^2, a sample cell Vdd decreases from 5V to 4.37V for the same RESET current, thus reducing power to 76% (assuming 2T1R cell has the same area), as shown in FIG. 6. The voltage and power consumption required by a disclosed 2T1R design is thus much lower than that of a 1T1R design. FIG. 6 is a summary chart 6000 illustrating the voltage and power consumption of two different designs.

Therefore, based on the results of simulation and experimentation described in the present disclosure, a 2T1R design that includes at least one PMOS and at least one NMOS can provide higher device density and lower operation voltage, both of which desirable when scaling up a RRAM crossbar array circuit.

It should be noted that because a SEL line does not dissipate DC current, it does not need to be wide. Because a 2T1R cell needs both a SEL line and a SEL_b line, the 2T1R cell's Resistor-Capacitor (RC) delay will be increased. The increased RC delay, however, does not have a significant impact in small crossbar arrays, because the read speed is not dictated by RC delays on a SEL (or SEL_b) line for small arrays.

In some implementation, a 2T1R cell includes one NMOS and one PMOS; in some implementations, a 2T1R cell includes two or more NMOS' and one PMOS; in some other implementations, a 2T1R cell includes one NMOS and two or more PMOS'; and in still some other implementations, a 2T1R cell includes tw or more NMOS' and two or more PMOS'.

Figure 7B:
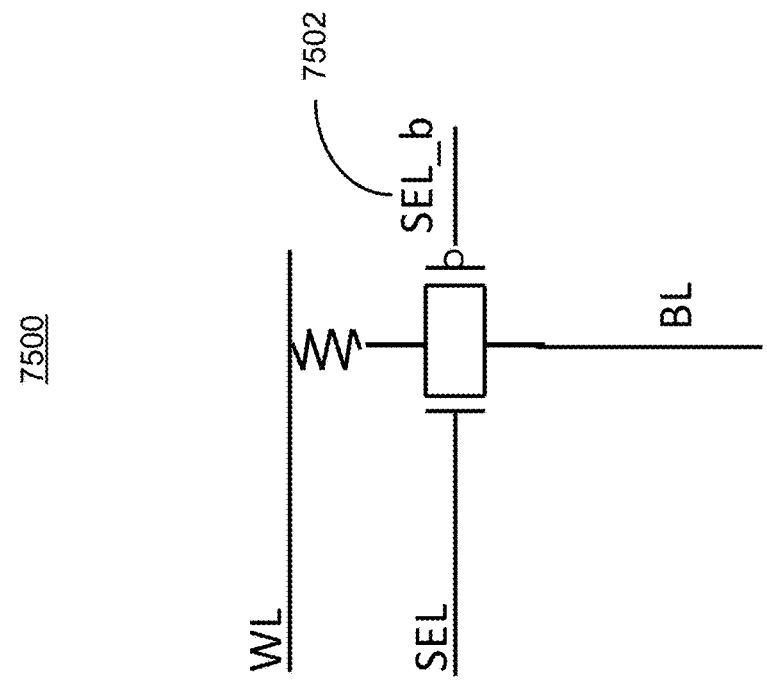
FIGS. 7A-7B are block diagrams illustrating a 2T1R RRAM cell design and a 1R2T RRAM cell design, respectively, in accordance with some implementations of the present disclosure.
Figure 7A:
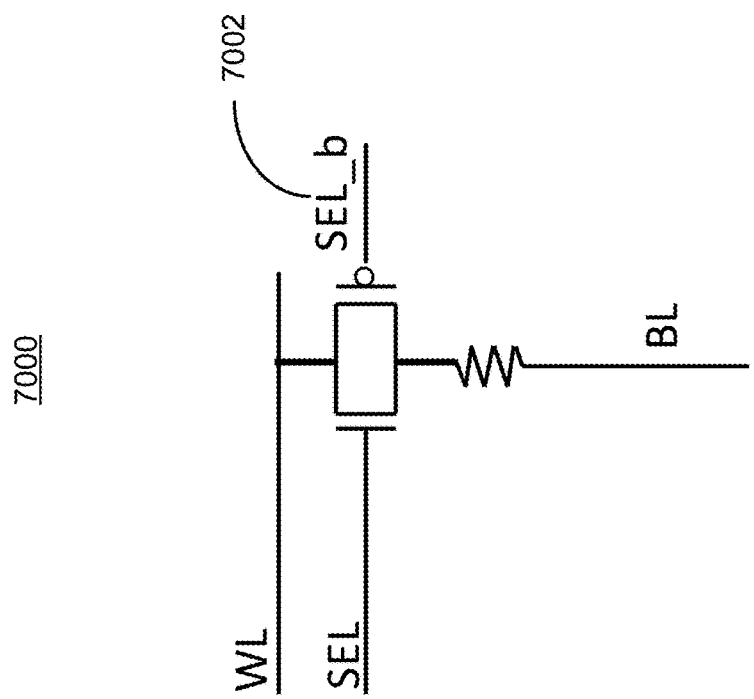

FIGS. 7A-7B are block diagrams 7000 and 75000 illustrating a 2T1R RRAM cell design and a 1R2T RRAM cell design, respectively, in accordance with some implementations of the present disclosure. The implementations of the 2T1R RRAM cell and the 1R2T RRAM cell include two transistor (as opposed to a single transistor) and thus require an additional selector voltage source to control the second transistor (e.g., the transistors 7002 and 7505 as shown in FIGS. 7A and 7B, respectively).

To resolve the routing issue and to avoid building separate SEL/SEL_b global drivers, while maintaining a small area size, an inverter may be used, in some implementations.

Figure 8:
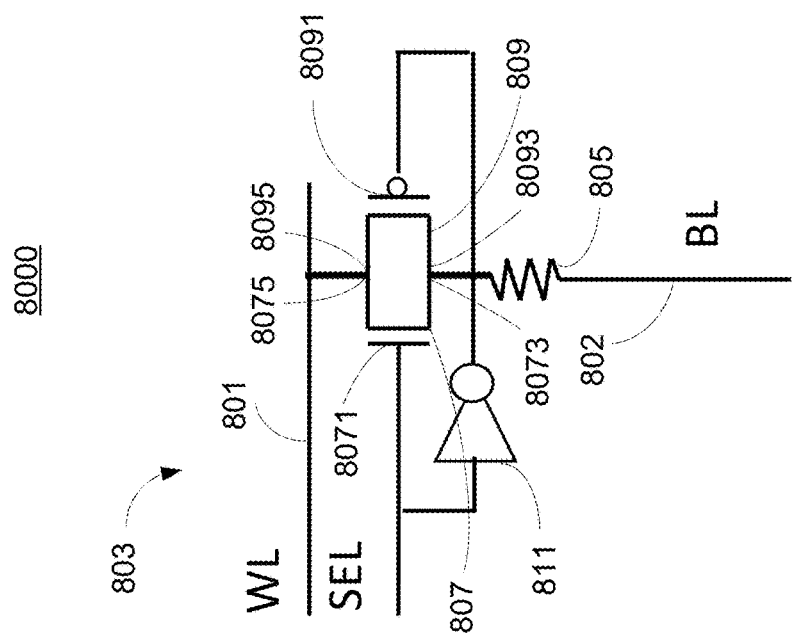
FIG. 8 is a block diagram illustrating an example 2T1R RRAM cell in accordance with some implementations of the present disclosure.

FIG. 8 is a block diagram 8000 illustrating an example 2T1R RRAM cell 803 in accordance with some implementations of the present disclosure.

As shown in FIG. 8, the 2T1R RRAM cell 803 includes a word line 801, a bit line 802, a first transistor 807 (e.g., an NMOS transistor 807), a second transistor 809 (e.g., a PMOS transistor 809), an RRAM device 805, and an inverter 811.

The NMOS transistor 807 and the PMOS transistor 809 are connected in series with the RRAM device 805. To be more specific, the RRAM device 805 is connected between a first source terminal 8073 of the NMOS transistor 807 and the bit line 802, and between a second source terminal 8093 of the PMOS transistor 809 and the bit line 802. A first drain terminal 8075 of the NMOS transistor 807 is connected to the word line 801. A second drain terminal 8095 of the PMOS transistor 809 is connected to the word line 801. A first gate terminal 8071 of the NMOS transistor 807 is connected to a first selector voltage source. A second gate terminal 8091 of the PMOS transistor 809 is connected to the first gate terminal 8071 via the inverter 811.

Therefore, in the implementation shown in FIG. 8, a single voltage source may (via the inventor 811) control both the first gate terminal 8071 and the second gate terminal 8091. The implementation shown in FIG. 8 thus reduces routing overhead that may otherwise result from a 2T1R design, while still maintaining a higher RESET voltage and a lower area size.

In some implementations, the inverter 811 includes an NMOS inverter, a PMOS inverter, a CMOS inverter, or a combination thereof.

Figure 9:
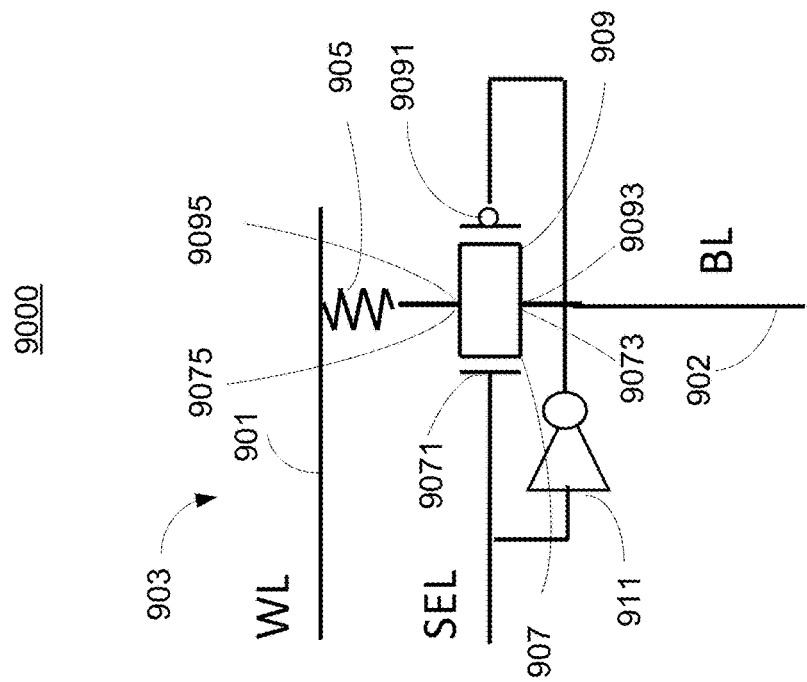
FIG. 9 is a block diagram illustrating an example 1R2T RRAM cell in accordance with the implementations of the present disclosure.

FIG. 9 is a block diagram 9000 illustrating an example 1R2T RRAM cell 903 in accordance with the implementations of the present disclosure.

As shown in FIG. 9, a 1R2T RRAM cell 903 includes a word line 901, a bit line 902, a first transistor 907 (e.g., an NMOS transistor 907), a second transistor 909 (e.g., a PMOS transistor 909), an RRAM device 905, and an inverter 911.

The NMOS transistor 907 and the PMOS transistor 909 are connected in series with the RRAM device 905. To be more specific, the RRAM device 905 is connected between a first drain terminal 9075 of the NMOS transistor 907 and the word line 901, and between a second drain terminal 9095 of the PMOS transistor 909 and the word line 901. A first source terminal 9073 of the NMOS transistor 907 is connected to the bit line 902. A second source terminal 9093 of the PMOS transistor 909 is connected to the bit line 902. A first gate terminal 9071 of the NMOS transistor 907 is connected to a first selector voltage source. A second gate terminal 9091 of the PMOS transistor 909 is connected to the first gate terminal 9071 via the inverter 911.

Therefore, in the implementation shown in FIG. 9, a single voltage source may (via the inventor 911) control both the first gate terminal 9071 and the second gate terminal 9091. The implementation shown in FIG. 8 thus reduces routing overhead that may otherwise result from a 1R2T design, while still maintaining a higher RESET voltage and a lower area size.

In some implementations, the inverter 911 includes an NMOS inverter, a PMOS inverter, a CMOS inverter, or a combination thereof.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus comprising:
   a word line;
   a bit line;
   a first NMOS transistor;
   a second PMOS transistor;
   an RRAM device, wherein the first NMOS transistor and the second PMOS transistor are in parallel as a pair, wherein the pair connects in series with the RRAM device; and
   an inverter, wherein a second gate terminal of the second PMOS transistor is connected to a first gate terminal of the first NMOS transistor via the inverter, wherein the first gate terminal and the inverter is connected to a selector voltage source that controls the first gate terminal of the first NMOS transistor and the second gate terminal of the second PMOS transistor, wherein the selector voltage source controls the second gate terminal of the second PMOS transistor via the inverter, wherein the selector voltage source controls both the first NMOS transistor and the second PMOS transistor to control whether the RRAM device is to be programmed, wherein the RRAM device is selected to be programmed via the first NMOS transistor and the second PMOS transistor when the selector voltage source is set to a first value, and wherein the RRAM device is not selected to be programmed via the first NMOS transistor and the second PMOS transistor when the selector voltage source is set to a second value.

2. The apparatus as claimed in claim 1, wherein the RRAM device is connected between the first NMOS transistor and the bit line, and wherein the RRAM device is connected between the second PMOS transistor and the bit line.

3. The apparatus as claimed in claim 1, wherein the inverter comprises at least one of an NMOS inverter, a PMOS inverter, or a CMOS inverter.

4. The apparatus as claimed in claim 2, wherein the RRAM device is connected between a first source terminal of the first NMOS transistor and the bit line, and wherein the RRAM device is connected between a second source terminal of the second PMOS transistor and the bit line.

5. The apparatus as claimed in claim 2, wherein a first drain terminal of the first NMOS transistor is connected to the word line; and wherein a second drain terminal of the second PMOS transistor is connected to the word line.

6. The apparatus as claimed in claim 1, further comprising: two or more NMOS transistors including the first NMOS transistor.

7. The apparatus as claimed in claim 1, further comprising: two or more PMOS transistors including the second PMOS transistor.

8. The apparatus as claimed in claim 1, further comprising: two or more NMOS transistors and two or more PMOS transistors.

9. An apparatus comprising:
a word line;
a bit line;
a first transistor;
a second transistor;
an RRAM device, wherein the first transistor and the second transistor are connected in series with the RRAM device, wherein the RRAM device is connected between a first drain terminal of the first transistor and the word line, wherein the RRAM device is connected between a second drain terminal of the second transistor and the word line, wherein a first source terminal of the first transistor is connected to the bit line, wherein a second source terminal of the second transistor is connected to the bit line, wherein a first gate terminal of the first transistor is connected to a selector voltage source, wherein the selector voltage source controls both the first gate terminal of the first transistor and a second gate terminal of the second transistor, wherein the selector voltage source controls both the first transistor and the second transistor to control whether the RRAM device is to be programmed, wherein the RRAM device is selected to be programmed via the first transistor and the second transistor when the selector voltage source is set to a first value, and wherein the RRAM device is not selected to be programmed via the first transistor and the second transistor when the selector voltage source is set to a second value; and an inverter, wherein the second gate terminal of the second transistor is connected to the first gate terminal of the first transistor via the inverter, wherein the inverter is connected to the selector voltage source, and wherein the selector voltage source controls the second gate terminal of the second transistor via the inverter.

10. The apparatus as claimed in claim 9, wherein the first transistor is an NMOS transistor and the second transistor is a PMOS transistor.

11. The apparatus as claimed in claim 10, wherein the first transistor comprises two or more NMOS transistors.

12. The apparatus as claimed in claim 10, wherein the second transistor comprises two or more PMOS transistors.

13. The apparatus as claimed in claim 1, wherein the selector voltage source controls the first gate terminal of the first NMOS transistor and the second gate terminal of the second PMOS transistor via a select line, and wherein the first gate terminal of the first NMOS transistor and the inverter are connected to the select line.

14. The apparatus as claimed in claim 9, wherein the selector voltage source controls the first gate terminal of the first transistor and the second gate terminal of the second transistor via a select line, and wherein the first gate terminal of the first transistor and the inverter are connected to the select line.

* * * * *